United States Patent [19]

Maier

[11] Patent Number: 4,685,150

[45] Date of Patent: Aug. 4, 1987

[54] TUNING OF A RESONANT CIRCUIT IN A COMMUNICATIONS RECEIVER

[75] Inventor: Gerhard Maier, Dauchingen, Fed. Rep. of Germany

[73] Assignee: Deutsche Thomson-Brandt GmbH, Villingen-Schwenningen, Fed. Rep. of Germany

[21] Appl. No.: 588,892

[22] Filed: Mar. 12, 1984

[30] Foreign Application Priority Data

Mar. 11, 1983 [DE] Fed. Rep. of Germany ....... 3308690

[51] Int. Cl.$^4$ ............................................. H04B 1/16
[52] U.S. Cl. .................................. 455/183; 455/186; 455/197; 455/226; 455/340
[58] Field of Search ............... 455/165, 183, 185, 186, 455/193, 195, 196, 197, 226, 340

[56] References Cited

U.S. PATENT DOCUMENTS

| | | | |
|---|---|---|---|
| 4,334,323 | 6/1982 | Moore | 455/186 |
| 4,368,541 | 1/1983 | Evans | 455/197 |
| 4,402,089 | 8/1983 | Knight | 455/197 |

Primary Examiner—Jin F. Ng
Attorney, Agent, or Firm—Horst M. Kasper

[57] ABSTRACT

A method and apparatus is provided for the tuning of the resonant circuits of a communications receiver. The frequency $f_D$ is generated with an additional oscillator, which frequency is then mixed with the receiver oscillator frequency, of which three frequencies $f_0$, $f_0+f_D$, $f_0-f_D$ are formed and are applied to the antenna output. The frequency $f_D$, which is evaluated as a narrow band, is generated by mixing at the intermediate frequency output. A maximum balancing is provided over all high-frequency circuits. The acceptor circuits are tuned to $f_0$ and $f_0+f_D$ (N+5, N+11) for obtaining maximum damping of the oscillator frequency and of the mirror frequency, where N+5 and N+11 represent mirror frequencies.

18 Claims, 4 Drawing Figures

TUNING OF A RESONANT CIRCUIT IN A COMMUNICATIONS RECEIVER

BACKGROUND OF THE INVENTION

1. Field of the Invention

The present invention relates to a method and apparatus for the tuning of resonant circuits of a communications receiver, and in particular of television and radio receiver apparatus with an oscillator circuit employing a phase-locked loop system and a mixing stage for generation of an intermediate frequency, where in the course of tuning of the receiver apparatus the individual filter circuits are balanced to optimum values and the determined tuning values are coordinated to voltage-variable diodes of the individual filter circuits.

2. Brief Description of the Background of the Invention Including Prior Art

A tuner unit is known from German Patent Application Laid Open DE-OS No. 2,854,852, which automatically tunes the high frequency circuits employing a phase-locked loop tuning system and employing three auxiliary oscillators and analog storage units coordinated to the oscillators. Here a number of auxiliary oscillators, corresponding to the number of high frequency circuits to be balanced, is required. The number of the necessary auxiliary oscillators and thus the materials requirements increase particularly in that case if for example for a television receiver Band I, Band III, and the bands IV and V are to be balanced. The danger of ambiguities exists between the frequencies of the tuner oscillator, of the auxiliary oscillators and of the receiver frequencies. It is disadvantageous for a practical realization of the proposed tuning unit that the exciting coil windings of the auxiliary oscillators can cause undesired resonances and damping effects, which in addition cause an uncontrolled mistuning of the circuits, if the auxiliary oscillators are turned off after performance of the balancing. In addition, analog storage provisions are furnished, which have to be reloaded at time intervals in order to obtain optimum tuning values. For these reasons an optimum balancing of the receiver apparatus cannot be obtained. In addition, disturbances on the screen or in the speaker become visible or, respectively, can be heard, caused by the frequently repeating of the fine tuning.

A tuning method for radio receivers is described in the journal "Nachrichten elektronik", issue 11, 1979, pages 365–368 which also employs additional auxiliary circuits in the high frequency filters. Here again disadvantageous influences on the circuits occur during operation of the tuned receiver. As the left and middle column on page 367 indicate, the accuracy of the tuning based on special devices is achieved only based on exactly paired diodes. This again requires expenditures which cannot be neglected.

SUMMARY OF THE INVENTION

1. Purposes of the Invention

It is an object of the present invention to provide an automatic self-tuning of a communication receiver apparatus, which reduces interfering mirror frequencies and disturbances of the receiver oscillator frequencies to a minimum.

It is another object of the present invention to provide a communication receiver, which processes generated intermediate frequency signals in a very narrow band width filter circuit.

It is another object of the present invention to furnish a communications receiver which does not require the switching off of the antenna signals during tuning.

These and other objects and advantages of the present invention will become evident from the description which follows.

2. Brief Description of the Invention

The present invention provides a method for tuning of a resonant circuit of a communications receiver apparatus. An oscillator frequency fo is provided with a receiver oscillator with the aid of a phase locked loop tuning system. A receiver channel is selected via a microprocessor. An additional oscillator with a fixed frequency $f_D$ is switched on for generating together with the oscillator frequency in a mixing stage three frequencies (fo, fo+$f_D$, fo−$f_D$). The three frequencies are applied to the antenna input of the receiver apparatus. A resonant circuit not involved in the balancing based on high frequency filters coupled as multiple section circuits is detuned such that it is disposed outside of the frequency (fo−$f_D$). For the individual tuning circuits, upon tuning of the receiver apparatus, generated tuning voltages are balanced to optimum values with the aid of tuning voltages generated with stepwise changed tuning voltages. Voltage-variable diodes of the individual filter circuits are coordinated to the determined tuning values. Tuning voltage values are generated by tuning of the receiver apparatus. A voltage is passed to an evaluation circuit, where the voltage is provided by the output of the mixer stage of the receiver apparatus via a narrow band filter, tuned to the frequency of the additional oscillator. Any further changes of the tuning of the just tuned resonator circuit are interrupted upon reaching of a maximum input voltage at the evaluation circuit by the microprocessor. The individual tuning values are stored in memory after balancing of all high frequency filter circuits responsible for a selection. The thereby generated tuning voltage values are fed to an acceptor circuit to be tuned to the mirror frequency of the selected channel. The tuning voltage for the acceptor circuit is retained in the evaluation circuit in case of an optimum tuning of the acceptor circuit with an analog-digital converter. The same sequence of balancing steps for an acceptor circuit is performed for the oscillator frequency fo. The high frequency filter circuits are switched to the maximum tuning voltage during the balancing process of the acceptor circuit. The additional oscillator and mixer are turned off after the balancing process.

An additional oscillator can be employed having a frequency $f_D$ selected such that upon incoming received signals with a single carrier it meets the requirement $f_D = f_o − f_e$, where $f_o$ is the oscillator frequency and where $f_e$ is the received signal frequency. Alternatively, an additional oscillator can be employed having a frequency $f_D$ selected such that upon incoming received signals with two carriers it meets the requirement $f_D = f_o − (f_B + f_T)/2$, where $f_o$ is the oscillator frequency and where $f_B$ and $f_T$ are the two received signal frequencies. The resonator circuit not involved with the balancing in a high frequency filter of several section circuits can be detuned such that the maximum possible tuning voltage $V_{Tmax}$ is applied to the voltage-variable diode of the other circuit to be disconnected in the lower tuning region at values less than $V_{Tmax}/2$ for the circuit to be balanced and the minimum tuning voltage $V_{Tmin}$ is applied to the voltage-variable diode of the other circuit to be switched off in the upper tuning region at values larger than $V_{Tmax}/2$ for the circuit to be balanced.

The maximum of the voltage at the acceptor circuit coil can be measured for determining an optimum balancing of the acceptor circuits, which are to suppress the interfering oscillator frequency at the antenna input and the mirror frequency ahead of the tuner mixer. The voltage fed to the antenna input can be less than about 44 dBuV. The tuner control voltage can be switched off during the automatic balancing procedure. The balancing process of the resonator circuit is performed with increasing tuner voltage. The narrow band intermediate frequency evaluation circuit can have a 3-dB band width of less than or equal to 1 megahertz.

There is also provided an electronic tuning resonant circuit of a communications receiver apparatus which comprises a microprocessor for selecting a receiver channel, an additional oscillator with a fixed frequency $f_D$ connected to the microprocessor, a receiver oscillator for providing an oscillator frequency fo, a mixing stage connected to the receiver oscillator and to the additional oscillator for mixing the frequency of the receiver oscillator fo and the frequency of the additional oscillator for providing three frequencies fo, fo+$f_D$, fo−$f_D$, an antenna input connected to the mixing stage for receiving the three frequencies from the mixing stage, an amplifier connected to the antenna, multiple section circuit coupled high frequency filters connected to the amplifier and where the one resonator circuit not involved in the balancing is detuned such as to be outside of the frequency range fo−$f_D$, a second mixing stage connected to the multiple section circuit high frequency filters for generating of an intermediate frequency, a narrow band filter connected to the second mixing stage and tuned to the frequency of the additional oscillator, an evaluation circuit connected to the narrow band filter and for interrupting via the microprocessor a further change of the tuning of the resonator circuit to be tuned in case a maximum input voltage is reached at the evaluation circuit, an acceptor circuit connected to the amplifier and to be tuned to the mirror frequency of the selected channel for receiving the generated adjustable tuning; an analog-digital converter connected to the microprocessor for setting the tuning voltage output and connected to a high frequency filter where in case of an optimum balancing of the acceptor circuit the tuning voltage is retained for this acceptor circuit and where the determined tuning values are coordinated to voltage-variable diodes of the individual filter circuits and where the receiver appartus is tuned by balancing the filter circuits successively based on stepwise changeable tuning voltages, and a second acceptor circuit for performing the same balancing process relating to the oscillator frequency $f_o$, where during the balancing process the acceptor circuits are switched to the maximum tuning voltage and where after the balancing process the additional oscillator and the first mixer are disconnected.

According to the invention method the intermediate frequency signals resulting from the evaluation can be optimally balanced in a very narrow band filter circuit. The antenna signals do not need to be switched off during the balancing and tuning. The interference requirements of postal authorities or of the Federal Communications Commission can be met by the steps provided according to the present application.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention.

DESCRIPTION OF INVENTION AND PREFERRED EMBODIMENT

Figure 1:
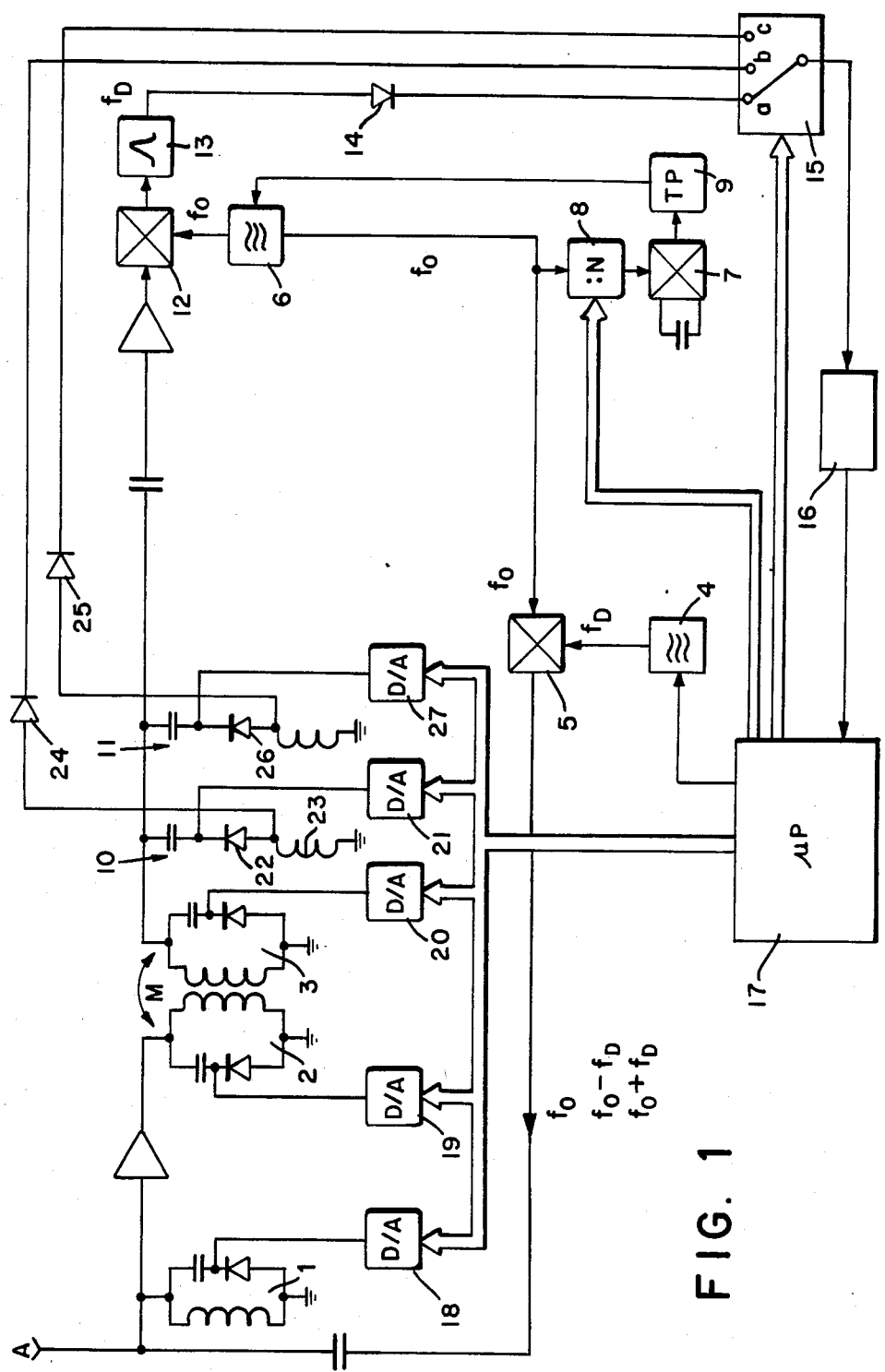
FIG. 1 is a view of a schematic block circuit diagram for illustrating an apparatus operating according to the present invention.

In accordance with the present invention there is provided a method for the tuning of resonant circuits of a communication receiver, in particular of a television or radio receiver set with an oscillator circuit employing a phase locked loop tuning system and a mixing stage for the generation of an intermediate frequency, where the individual filter circuits are successively balanced with the aid of step-wise changeable tuning voltage generated by a microprocessor via a digital-analog converter and the determined tuning values are coordinated to voltage-variable diodes of the individual tuning circuits. After selecting of a receiver channel an additional oscillator 4 with fixed frequency $f_D$ is turned on by the microprocessor 17. The additional oscillator 4 generates three frequencies fo, fo+$f_D$, and fo−$f_D$ from the oscillator frequency fo provided by the receiver oscillator 6 via a mixing stage 5. The three frequencies are applied to the antenna input of the receiver, where the resonant circuit not involved in the balancing is detuned such in case of multiple section circuit coupled high frequency filters 2, 3 that this resonant circuit is disposed outside of the frequency fo−$f_D$, where the voltage is taken from the output of the mixer stage 12 of the receiver apparatus via a narrow band filter tuned to the frequency fo of the additional oscillator 4 and applied to an evaluation circuit 16. A further change of the tuning of the resonant circuit presently to be tuned is interrupted by the microprocessor 17 upon reaching of the maximum input voltage occurring at the evaluation circuit 16. The individual tuning voltage values are retained after balancing of all high frequency filter circuits responsible for the operator selection. Then the generated variable tuning voltage is connected to a trap or acceptor circuit 10 to be tuned to the mirror frequency of the selected channel, where the evaluation circuit 16 retains the tuning voltage with a digital-analog converter 21 upon optimum balancing of the acceptor circuit 10. The same balancing process is then performed for an acceptor circuit 11 provided for the oscillator frequency, where during the balancing process of the acceptor circuits 10, 11 the high frequency filter circuits 1, 2, 3 are switched to the maximum tuning voltage. After the balancing process the additional oscillator 4 and the mixer 5 are turned off.

The frequency fo of the additional oscillator can be selected such that it corresponds to the equation $f_D = f_o - f_e$ in case of receiver signals with a single carrier, where fo represents the oscillator frequency and fe repesents the receiver frequency, and it corresponds to the equation $f_D = f_o - (f_B + f_T)/2$ in case of receiver signals with two carriers, where fo represents the oscillator frequency and where $f_B$ and $f_T$ represent the two receiver frequencies.

The detuning of the resonant circuit just not associated with the balancing in case of a multiple section circuit coupled high frequency filter is performed such that in the lower tuning region at values less than or equal to $V_{Tmax}/2$ for the circuit to be balanced, the maximum possible tuning voltage $V_{Tmax}$ is applied to the tuning diode of the other circuit to be turned off and that in the upper tuning region with values larger than $V_{Tmax}$ for the circuit to be balanced the minimum tuning voltage $V_{Tmin}$ is applied.

The determination of an optimum balancing of the acceptor circuits, which are to suppress the interfering oscillator frequency at the antenna input and the mirror frequency ahead of the tuner mixer, is performed by measuring the maximum of the voltage at the acceptor circuit coil. The voltage fed to the antenna input can be less than about 44 dBuV. The tuner control voltage can be turned off during the automatic balancing process. The balancing process of the resonant circuit can be performed with increasing tuning voltage. The narrow band intermediate frequency evaluation circuit can have a 3-dB band width of less than or equal to 1 megahertz.

The high frequency filter circuits of a television receiver apparatus are designated as 1, 2, and 3 and these filter circuits are to be balanced automatically in case of setting a receiver frequency. An additional oscillator 4 is switched on for this balancing, which generates a fixed frequency $f_D$, which is mixed in an additional mixing stage 5 with the oscillator frequency fo generated by the receiver oscillator 6. The receiver oscillator 6 is set to the oscillator frequency fo coordinated to a channel upon application of a channel with the aid of the phase locked loop circuit 7, 8, 9. The mixer stage 5 generates from the frequencies $f_D$ and fo three frequencies fo, fo+$f_D$, and fo−$f_D$, which are applied to the antenna input. The acceptor circuits disposed in the receiver apparatus are initially prevented from functioning by application of a maximum tuning voltage VTmax. The three frequencies fo, fo+$f_D$ and fo−$f_D$ are applied to the antenna input with a voltage of less than about 44 dBuV. All received signals in addition can be applied to the antenna input and they do not have to be switched off. Now the circuits 1, 2, 3 are successively balanced to the maximum at the intermediate frequency output. Here an intermediate voltage is generated based on the receiver oscillator frequency fo and on the mixer 12 and the intermediate voltage is sieved out via a narrow band circuit 13 and then evaluated. The 3 dB band width of this circuit should be 1 megahertz. The generated signal passes via a diode 13 and via a switch 15 to an evaluator stage 16, which feeds a signal to the microprocessor 17 upon determination of a maximum input value. The tuning voltages generated via the digital-analog converters 18, 19, 20 are retained and for example stored in a memory circuit.

The switch 15 is moved to the next position b after this balancing step and controlled by the microprocessor 17. The balancing procedure of the acceptor circuit 10, which for example is to be tuned to the oscillator frequency fo of the receiver, is then performed. The tuning values pass via the digital-analog converter 21 to the tuning diode 22 of the acceptor circuit 10. The voltage is picked up at the acceptor circuit coil 23 and is brought to the evaluation circuit 16 via a diode 24 and via a switch 15b. A like process occurs for the synthetically generated mirror frequency (N+11) for very high frequency television transmission (VHF) with the value $2f_o - (f_B + fr)/2$ with the aid of acceptor circuit 11 via the diode 25, where the switching stage 15 is connected to the contact terminal c. The corresponding mirror frequency fs, which is generated synthetically by the mixing stage 5, is applied to the antenna input. The tuning voltage for the tuning diode 26 is fed to it via the digital-analog converter 27. The same process with a corresponding phase circuit (not shown) to be tuned to the mirror frequency (N+9) occurs upon balancing of the UHF channels. The high frequency filter circuits 1–3 are switched to a maximum tuning voltage $VT_{max}$ during the balancing of the acceptor circuits 10 and 11. The additional oscillator 4 of the mixing stage is again switched off after the automatic balancing.

The circuit 2 or 3 not associated with the balancing is detuned during the balancing of the multiple section circuit band filters 2, 3. This occurs such that in the lower tuning voltage region at smaller or equal to $VT_{max}/2$ for the circuit to be balanced the maximum possible tuning voltage $VT_{max}$ is applied to the tuning diode of the other circuit to be switched off. In the upper tuning region at values larger than $VT_{max}/2$ for the circuit to be balanced, the minimum tuning voltage $VT_{min}$ is applied to the tuning diode of the other circuit to be switched off.

Figure 2A:
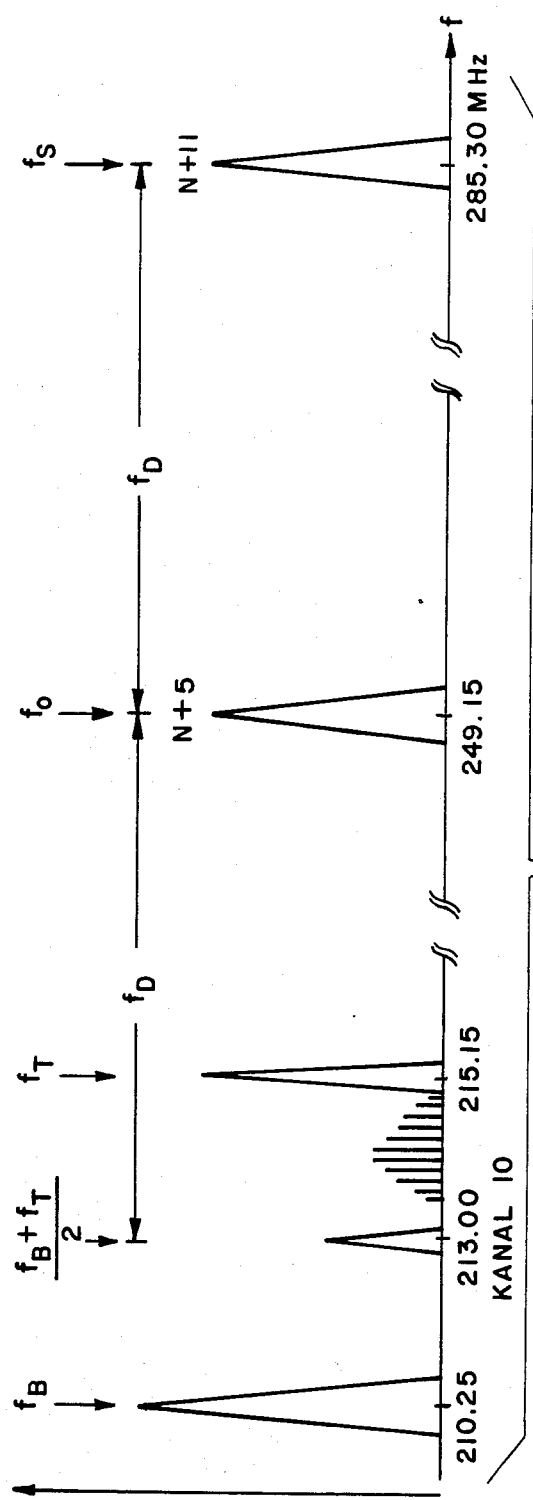
FIGS. 2a–2c are schematic diagrams of the frequency spectrum for illustrating the method employed in the apparatus of FIG. 1.
Figure 2C:
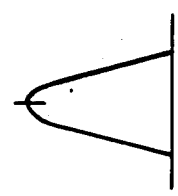
Figure 2B:

The situation is illustrated in FIG. 2a based on the example of the television receiver channel 10 of the European system. The frequency of the sound carrier is disposed at 210.25 megahertz and the frequency of the sound carrier is disposed at 215.75 megahertz. The oscillator frequency fo is set to 249.215 megahertz. The method of the above described tuning system generates the frequencies fo (249.15 megahertz), fo+$f_D$ (285.30 megahertz), fo−$f_D$ (213 megahertz) with the aid of the additional oscillator 4 via the mixing stage 5, which result from the mixing with oscillator frequency fo of the receiver oscillator 6. An intermediate frequency of 36.15 megahertz results at the output of the mixing stage 12 of the receiver circuit, which is sieved and filtered to a narrow band and is then evaluated. The frequency of 285.30 megahertz corresponds approximately to the mirror frequency (N+11) of the channel 10. The high frequency passage curve is shown in FIG. 2b, which curve results at the output after the balancing of the receiver. The pass band and transmission characteristics of the filter circuit 13 are illustrated in FIG. 2c.

It will be understood that each of the elements described above, or two or more together, may also find a useful application in other types of communication system configurations and signal processing procedures differing from the types described above.

While the invention has been illustrated and described as embodied in the context of a method for the tuning of resonant circuits of a communication receiver apparatus, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A method for tuning of a resonant circuit of a communications receiver apparatus comprising
providing an oscillator frequency fo with a receiver oscillator in a phase locked loop tuning system;
selecting a receiver channel via a microprocessor;
switching on an additional oscillator with a fixed frequency $f_D$ for generating together with a receiver oscillator frequency fo in a first mixing stage three frequencies fo, fo+$f_D$, fo−$f_D$;
applying the three frequencies to an antenna input of the receiver apparatus;
detuning a high frequency filter having an input not energized for balancing in a plurality of high frequency filters coupled as multiple section circuits such that this high frequency filter is disposed outside of the frequency fo−$f_D$, said high frequency filter having an output;
balancing an individual high frequency filter to optimum values with tuning voltages generated with stepwise changes induced by the microprocessor and thereby determining a plurality of tuning voltage values;
energizing voltage-variable diodes of individual high frequency filters coordinated to respective determined tuning voltage values;
passing a voltage to an evaluation circuit, where the voltage is provided by an output of a second mixer stage of the receiver apparatus via a narrow band filter tuned to the frequency of the additional oscillator;
interrupting any further changes of the tuning of the high frequency filter tuned in the above balancing step upon reaching of a maximum input voltage at the evaluation circuit by the microprocessor;
retaining in memory individual tuning voltage values after balancing of all high frequency filters;
feeding thereby determined tuning voltage values to an acceptor tuning circuit for tuning to the mirror frequency of a selected channel;
retaining the tuning voltage values for the acceptor tuning circuit in the evaluation circuit in case of an optimum tuning of the acceptor tuning circuit with an analog-digital converter;
performing the same sequence of balancing steps for an acceptor circuit provided for the receiver oscillator frequency fo;
switching the high frequency filters to the maximum tuning voltage during the balancing process of the acceptor tuning circuit; and
turning off the additional oscillator and first mixing stage after the balancing process.

2. The method for tuning of a resonant circuit of a communications receiver apparatus according to claim 1 wherein said additional oscillator oscillates at a frequency $f_D$ selected such that upon incoming received signals with a single carrier it meets the requirement $f_D$=fo−fe, where fo is the receiver oscillator frequency and where fe is a received signal frequency.

3. The method for tuning of a resonant circuit of a communications receiver apparatus according to claim 1 wherein said additional oscillator oscillates at a frequency $f_D$ selected such that upon incoming received signals with two carriers it meets the requirement $f_D$=fo−($f_B$+$f_T$)/2, where fo is the receiver oscillator frequency and where $f_B$ and $f_T$ are two received signal frequencies.

4. The method for tuning of a resonant circuit of a communications receiver apparatus according to claim 1 further comprising
detuning said high frequency filter such that the maximum possible tuning voltage $V_{Tmax}$ is applied to a voltage variable diode of a second high frequency filter to be disconnected in the lower tuning region at values less than $V_{Tmax}/2$ for the high frequency filter to be balanced and such that a minimum tuning voltage $V_{Tmin}$ is applied to the voltage variable diode of the second high frequency filter to be switched off in an upper tuning region at values larger than $V_{Tmax}/2$ for the high frequency filter to be balanced.

5. The method for tuning of a resonant circuit of a communications receiver apparatus according to claim 1 further comprising
measuring the maximum of the voltage at a coil forming part of the acceptor tuning circuit for determining an optimum balancing of the high frequency filter for suppressing an interfering oscillator frequency at the antenna input and a mirror frequency ahead of the first mixing stage.

6. The method for tuning of a resonant circuit of a communications receiver apparatus according to claim 1 wherein the voltage fed to the antenna input is less than about 44 dBuV.

7. The method for tuning of a resonant circuit of a communications receiver apparatus according to claim 1 wherein a tuner control voltage is switched off during the balancing process.

8. The method for tuning of a resonant circuit of a communications receiver apparatus according to claim 1
wherein the balancing process of the high frequency filter is performed with increasing tuning voltages induced by the microprocessor.

9. The method for tuning of a resonant circuit of a communications receiver apparatus according to claim 1 wherein the evaluation circuit is a narrow band intermediate frequency evaluation circuit, which has a 3-dB band width of less than or equal to 1 megahertz.

10. An electronic tuning resonant circuit of a communications receiver apparatus comprising
a microprocessor for selecting a receiver channel;
an additional oscillator with a fixed frequency $f_D$ connected to the microprocessor;
a receiver oscillator providing an oscillator frequency fo;
a first mixing stage connected to the receiver oscillator and to the additional oscillator for mixing the frequency of the receiver oscillator fo and the frequency of the additional oscillator for providing three frequencies fo, fo+$f_D$, fo−$f_D$;
an antenna input connected to the first mixing stage for receiving the three frequencies from the first mixing stage;
an amplifier connected to the antenna input;
a multiple section circuit of coupled high frequency filters connected to the amplifier and where one high frequency filter having an input and not energized with a signal at its input for balancing is detuned such as to be outside of a frequency range fo−$f_D$;